United States Patent
Reynolds et al.

(10) Patent No.: US 9,466,510 B2
(45) Date of Patent: Oct. 11, 2016

(54) ORGANIC ELECTRONIC DEVICES

(75) Inventors: Kieran Reynolds, Histon (GB); Jerome Joimel, Cambridge (GB)

(73) Assignee: FLEXENABLE LIMITED, Cambridge (GB)

( * ) Notice: Subject to any disclaimer, the term of this patent is extended or adjusted under 35 U.S.C. 154(b) by 0 days.

(21) Appl. No.: 13/701,779

(22) PCT Filed: Jun. 3, 2011

(86) PCT No.: PCT/EP2011/059219
§ 371 (c)(1),
(2), (4) Date: Feb. 12, 2013

(87) PCT Pub. No.: WO2011/151456
PCT Pub. Date: Dec. 8, 2011

(65) Prior Publication Data
US 2013/0143362 A1    Jun. 6, 2013

(30) Foreign Application Priority Data

Jun. 4, 2010   (GB) .................................. 1009398.7

(51) Int. Cl.
| | | |
|---|---|---|
| H01L 21/84 | (2006.01) | |
| H01L 21/58 | (2006.01) | |
| H01L 27/12 | (2006.01) | |
| H01L 29/786 | (2006.01) | |
| H01L 23/00 | (2006.01) | |
| H01L 51/00 | (2006.01) | |

(52) U.S. Cl.
CPC ............ *H01L 21/58* (2013.01); *H01L 24/80* (2013.01); *H01L 27/1266* (2013.01); *H01L 29/78603* (2013.01); *H01L 51/003* (2013.01); *H01L 51/0097* (2013.01)

(58) Field of Classification Search
CPC ............. H01L 21/58; H01L 27/1266; H01L 29/78603; H01L 51/1003; H01L 51/0097
USPC ........................................... 438/99, 151–166
See application file for complete search history.

(56) References Cited

U.S. PATENT DOCUMENTS

| | | |
|---|---|---|
| 5,757,126 A | 5/1998 | Harvey, III et al. |
| 2003/0164497 A1 | 9/2003 | Carcia et al. |
| 2012/0193721 A1* | 8/2012 | Joimel et al. .............. 257/368 |

FOREIGN PATENT DOCUMENTS

| | | |
|---|---|---|
| WO | 03/016589 A1 | 2/2003 |
| WO | 2008/057045 A1 | 5/2008 |
| WO | 2008/094353 A1 | 8/2008 |
| WO | 2009/014067 A1 | 1/2009 |
| WO | 2009/122823 A1 | 10/2009 |

OTHER PUBLICATIONS

British Search Report for GB1009398.7 dated Oct. 19, 2011.
International Search Report for PCT/EP2011/059219 dated Aug. 26, 2011.
Examination Report issued in corresponding Great Britain Patent Application No. GB1009398.7 dated Jul. 31, 2014.

* cited by examiner

*Primary Examiner* — Richard Booth
(74) *Attorney, Agent, or Firm* — Sughrue Mion, PLLC

(57) ABSTRACT

A technique comprising: mounting a device substrate on a processing support, forming one or more electronic elements on the device substrate with the device substrate thus mounted on the processing support; wherein the device substrate comprises an organic support structure, and provides primary protection for the overlying electronic elements against the ingress of a degrading species from a side of the device substrate opposite to the one or more electronic elements.

20 Claims, 5 Drawing Sheets

ORGANIC ELECTRONIC DEVICES

This application is a National Stage of International Application No. PCT/EP2011/059219, filed on Jun. 3, 2011, which claims priority from British Patent Application No. 1009398.7, filed on Jun. 4, 2010, the contents of all of which are incorporated herein by reference in their entirety.

The present invention relates to electronic devices, particularly devices including one or more organic layers as supporting layers.

The production of reliable electronic devices including organic support layers can be challenging for at least the following reason.

In such an organic electronic device, the electronic elements are typically supported on a plastic substrate via an overlying organic planarisation layer. It has been found that the electronic elements and/or the interfaces between the electronic elements of such a device tend to suffer from degradation caused by contaminants such as moisture and/or oxygen.

It is an aim of the present invention to provide a technique aimed at producing more reliable organic electronic devices.

The present invention provides a method, comprising: mounting a device substrate on a processing support, forming one or more electronic elements on the device substrate with the device substrate thus mounted on the processing support; wherein the device substrate comprises an organic support structure, and provides primary protection for the overlying electronic elements against the ingress of a degrading species from a side of the device substrate opposite to the one or more electronic elements.

In one embodiment, the processing support is a planar carrier.

In one embodiment, the method further comprises: securing said device substrate to said carrier using one or more adhesive layers; and wherein the device substrate provides primary protection for the overlying electronic elements against the ingress of a degrading species via the one or more adhesive layers and/or otherwise via the surface of the device substrate adjacent to said one or more adhesive layers.

In one embodiment, the device substrate has a smaller water vapour transmission rate than any layer between the carrier and the device substrate.

In one embodiment, the device substrate is formed directly on an adhesive unit provided on the carrier.

In one embodiment, the adhesive unit comprises adhesive layers on opposite sides of a support layer.

In one embodiment, the method further comprises providing a planarisation layer between the device substrate and the electronic elements.

In one embodiment, the method further comprises forming the device substrate as a multilayer structure before temporarily securing the device substrate to the processing support.

In one embodiment, the multilayer structure comprises a support portion and a barrier portion having a lower water vapour transmission rate than the support portion.

In one embodiment, the degrading species is moisture and/or oxygen.

In one embodiment, said device substrate is mounted on the processing tool as part of a sheet that provides a plurality of device substrates.

In one embodiment, the device substrate has a water vapour transmission rate of between about $10^{-1}$ and $10^{-7}$ g/m$^2$/24 hours.

The present invention also provides a device including an organic support structure supporting an array of electronic elements via a planarisation layer, and an inorganic moisture barrier layer between the organic support structure and the planarisation layer.

The present invention also provides a device including an organic support structure supporting an array of electronic elements via a planarisation layer, and an inorganic moisture barrier layer deposited on the opposite side of the organic support structure to the planarisation layer.

In one embodiment, the moisture barrier layer has a water vapour transmission rate of no more than 0.1 times that of the organic support structure.

In one embodiment, the moisture barrier layer has a water vapour transmission rate of between about $10^{-1}$ and $10^{-7}$ g/m$^2$/24 hours.

The present invention also provides a method comprising: mounting a device substrate on a processing support via a barrier element, and forming one or more electronic elements on the device substrate with the device substrate thus mounted on the processing support; wherein the barrier element provides primary protection for the overlying electronic elements against the ingress of a degrading species via the side of said barrier element opposite to the device substrate.

In one embodiment, the method further comprises: securing said barrier element to said carrier using one or more adhesive layers; and wherein the barrier element provides primary protection for the overlying electronic elements against the ingress of a degrading species via the one or more adhesive layers.

An embodiment of the present invention is described in detail hereunder, by way of example only, with reference to the accompanying drawings, in which:—

To help understanding of the invention, a specific embodiment thereof will now be described by way of example and with reference to the accompanying drawings, in which.

Figure 1:
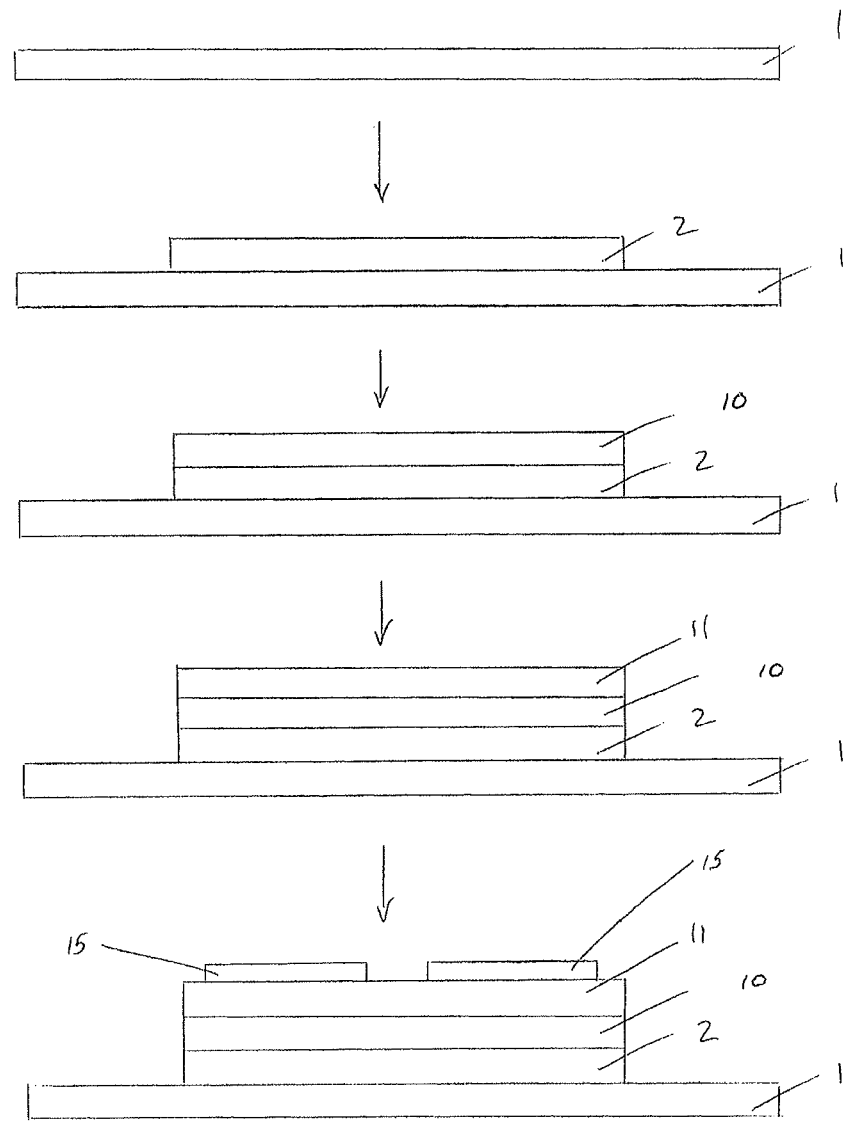
FIG. 1 illustrates the production of an electronic device, including the step of adhering a device substrate to a carrier.

FIG. 1 illustrates the production of a TFT array. In a first step, an adhesive element 2 is applied to a rigid glass carrier 1 (also referred to as a "mother plate"). In a second step, a sheet 10 of device substrate material is applied to the adhesive element 2. The sheet of device substrate material forms the device substrates for a plurality of display devices. In effect, a plurality of device substrates are thus temporarily secured to the carrier. The parts of sheet 10 between the areas that define the plurality device substrates are removed in a later step. In a third step, a planarising layer 11 is formed over the sheet 10 of device substrate material. The adhesive element 2 is designed such that its tackiness can be reduced by the application of heat or UV irradiation to facilitate the later removal of the device substrates from the carrier at a later stage of the production process. In a series of subsequent steps, respective arrays 15 of TFTs are formed on the areas of the sheet 10 of device substrate material that form the plurality of device substrates. For an array of top-gate TFTs, this series of subsequent steps includes: forming a patterned conductive layer to define source and drain electrodes and interconnect lines; forming a semiconducting channel between each pair of source and drain electrodes; forming a gate dielectric layer over the semiconducting channels, and forming an upper patterned conductive layer to define the gate electrodes of the TFTs and the gate addressing lines. For an array of top-gate structures, the series of subsequent steps includes: forming a patterned conductive layer to define the gate electrodes and gate addressing lines for the array of TFTs; forming a gate dielectric layer over the patterned conductive layer; forming an upper patterned conductive layer to define the source and drain electrodes and interconnect lines for the array of TFTS, and forming a semiconducting channel between each pair of source and drain electrodes.

Adhesive elements 2 of the kind used to temporarily secure the sheet 10 of device substrate material to the carrier 1 are found to be a source of degrading contaminants and/or a route for the ingress of degrading contaminants from the atmosphere to inner portions of the device substrate material sheet 10 on which the TFT arrays 15 are formed. For example, the adhesive material of adhesive element 2 can have a high water vapour transmission rate (WVTR), and provide a lateral route for moisture and/or oxygen from the atmosphere to inner portions of the device substrate material layer 10 upon which the TFT arrays 15 are formed. Also, the adhesive bond line between the adhesive element 2 and the device substrate material sheet 10 is thought to provide a lateral route for moisture and/or oxygen from the atmosphere to inner portions of the device substrate material sheets upon which the TFT arrays 15 are formed. If the device substrate material 10 comprises a plastic substrate material, then there is a concern that such moisture and/or oxygen might permeate through the device substrate material sheet 10 and degrade the electronic elements that make up the TFTs or the interfaces between them.

Hereunder are described examples of substrates designed to prevent the ingress of water from the adhesive element 2 to the electronic elements that form the TFT arrays 15.

According to one embodiment, the substrate material sheet 10 consists of a single layer of a material that has a lower WVTR than PET. For example, the device substrate material sheet 10 consists of a single layer of a fluoropolymer.

According to another embodiment of the invention, the device substrate material sheet 10 has a pre-prepared bilayer structure comprising two portions 10a, and 10b; a first support portion 10b that provides a flexible structural support for the TFT arrays 15, and a second barrier portion 10a that provides a barrier against the transmission of moisture and/or oxygen, and has a lower WVTR than the support portion 10b. The bilayer structure is prepared before it is secured in a single lamination step to the carrier 1.

The barrier portion 10a may be an impervious, pinhole-free layer, such as $Al_2O_3$, ITO, $SiO_2$ or $SiN_x$, which may be deposited through techniques such as physical vapour deposition (PVD), atomic layer deposition (ALD), plasma-enhanced chemical vapour deposition (PE-CVD), sputtering or further evaporation or wet coating techniques. In this embodiment, the support portion 10b is a thin film of plastics, such a 20 micron film of PET. The combination of the support portion 10b and the barrier portion 10a provides a device substrate sheet 10 that blocks the ingress from the adhesive element 2 to the TFT arrays 15 of species which are able to degrade the performance of the TFTs (or any other sensitive elements above the TFTs such as a display medium), such as a high concentration of oxygen and/or moisture.

The support portion 10b may alternatively comprise a thin sheet of glass or a thin film of a different plastic such as polyethylenenaphtalene (PEN) is used. The support portion 10b has a smooth surface to enable the deposition of a layer of barrier material to form the barrier portion 10a, without leaving defect sites such as pinholes, which could impair the barrier performance.

As mentioned above, a planarising layer 11 is deposited over the upper surface of the device substrate material sheet 10 after the device substrate material sheet 10 is secured to the carrier 1 via the adhesive element 2. The planarising layer 11 ensures a smooth surface for the formation of the TFT arrays 15. It also serves to protect the areas of the device substrate material sheet that form the device substrates from the subsequent processing used to form the arrays of TFTs 15. The planarising layer 11 is a hard-coat material, such as a U.V. acrylate. It may also be a material that can be deposited by physical vapour (PV) deposition or chemical vapour deposition (CVD). The TFT arrays 15 are formed directly on the planarisation layer 11.

The device substrate material sheet 10 has a water vapour transmission rate of between $10^{-1}$ and $10^{-7}$ $g/m^2/24$ hours, and more particularly about 0.05 $g/m^2/24$ hours, as measured under the following conditions: atmospheric pressure; 100% relative humidity; and a temperature of 38° C. A water vapour permeation instrument provided by Mocon, Inc. can be used to measure the water vapour transmission rate.

Figure 2:
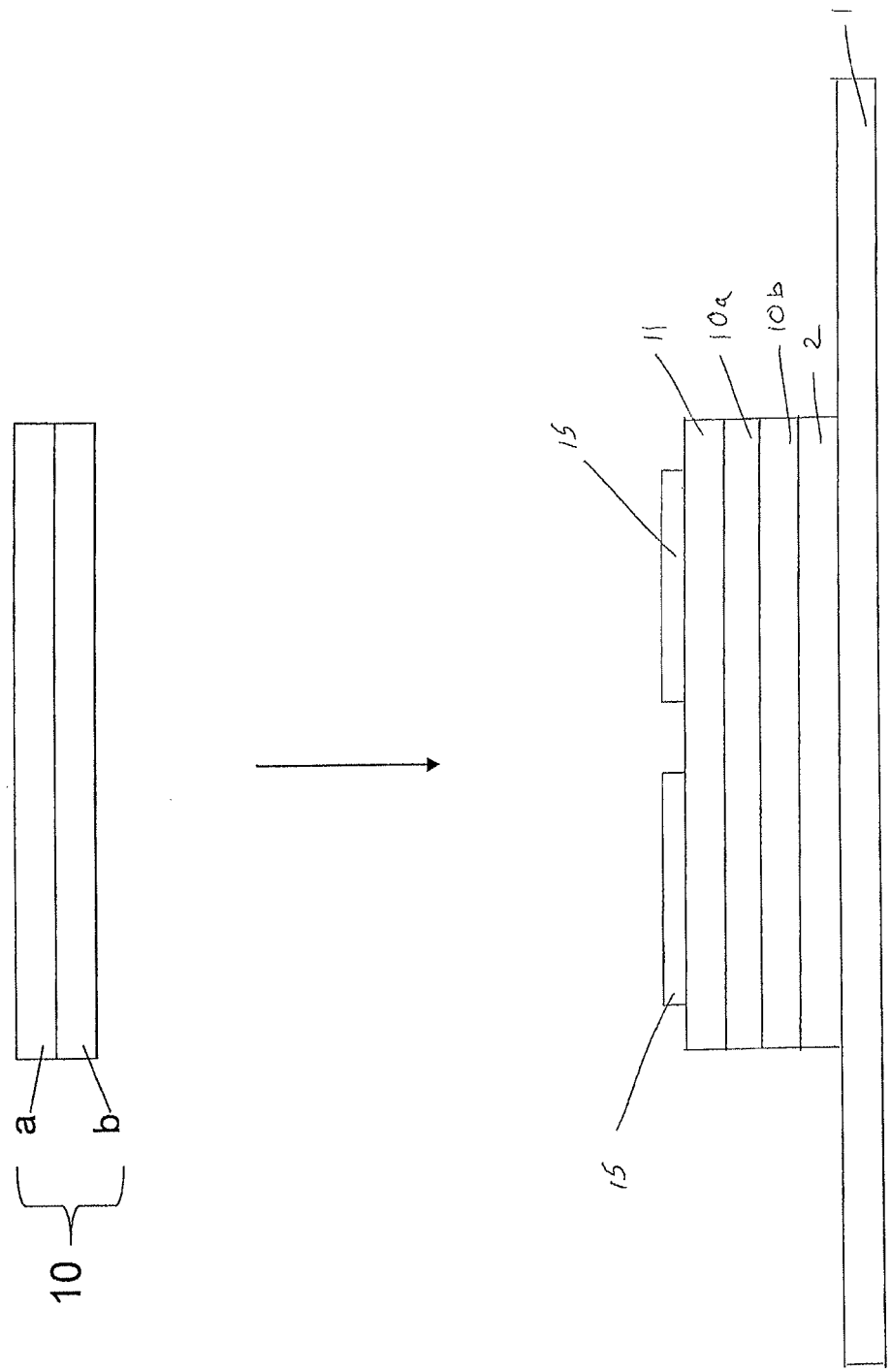
FIG. 2 illustrates one example of a structure for the device substrate of FIG. 1 in accordance with a first embodiment of the present invention.

In the embodiment illustrated in FIG. 2, the device substrate material sheet 10 is secured to the carrier 1 with the support portion 10b between the carrier 1 and the barrier portion 10a, such that the barrier portion 10a is located between the support portion 10b and the planarising layer 11.

Figure 3:
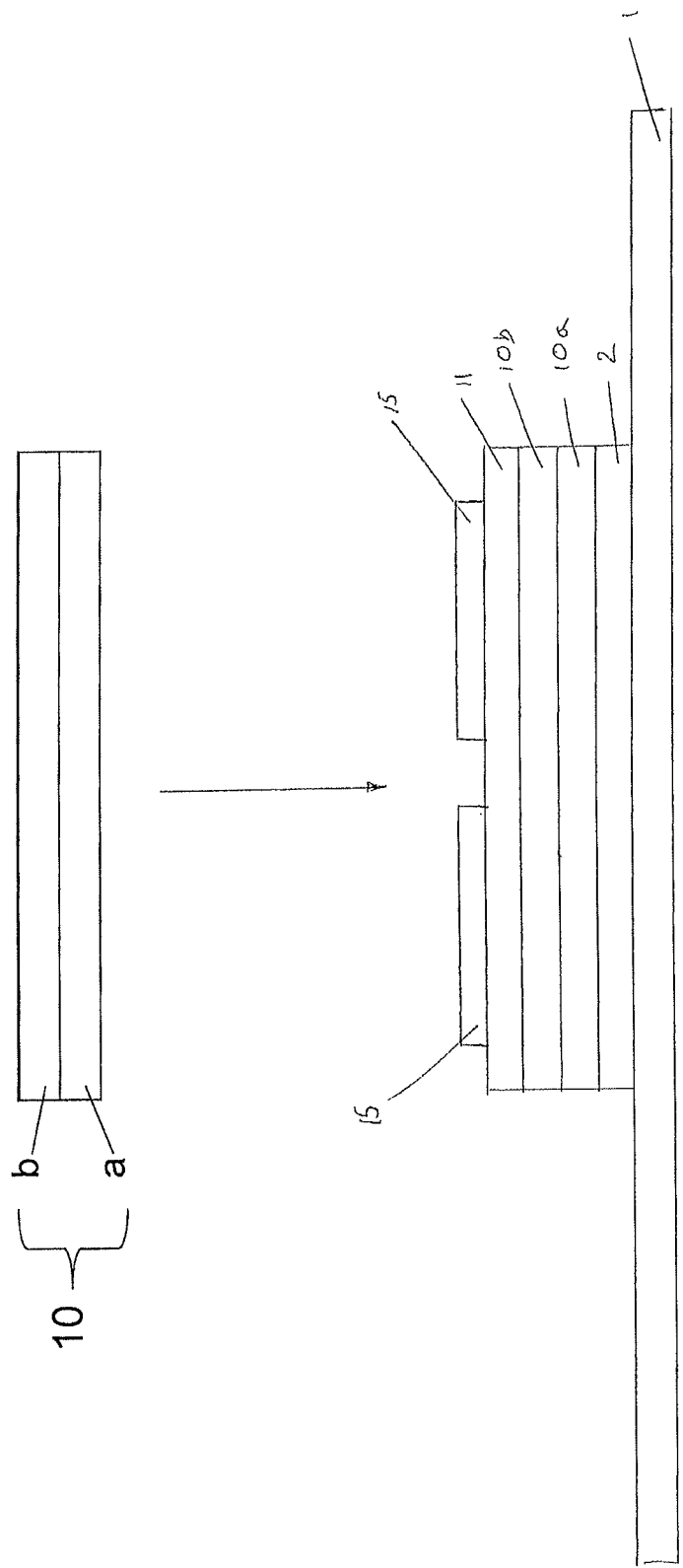
FIG. 3 illustrates another example of a structure for the device substrate of FIG. 1 in accordance with a second embodiment of the present invention.

In the embodiment illustrated in FIG. 3, the device substrate material sheet 10 is secured to the carrier with the barrier portion 10a between the carrier 1 and the support portion 10b, such that the support portion 10b is located between the barrier portion 10a and the planarisation layer 11. This alternative architecture is useful, for example, in situations where the material of the planarising layer 11 would not adhere well to the material of the barrier portion 10a.

In the embodiments described above, the device substrate material sheet 10 is flexible enough to make it possible to apply it to one or more carriers in a roll-to-roll mass production process. In order to further facilitate the use of a roll-to-roll process, the device substrate material sheet 10 may include an additional layer (not shown) designed to prevent blocking of the reel (i.e. static-induced sticking together of the reel). Layers suited to this purpose are typically rough and generally of insufficient surface quality to provide a surface for the formation of high resolution active matrix TFT arrays, and are also easily mechanically damaged. The deposition of a planarisation layer 11 on the device substrate material sheet 10 after it is secured to the carrier 1 is particularly effective where the device substrate material sheet includes such an additional layer.

In the embodiment illustrated in FIG. 3 where the barrier portion 10a is located on the opposite side of the support portion 10b to the TFT arrays 15, the ingress of moisture and/or oxygen through to the TFT arrays 15 is minimized by incorporating in the device substrate material sheet 10a barrier portion 10a having a low water vapour transmission rate (WVTR) and using a thin support portion 10b that presents only a small cross-sectional area (CSA) to the atmosphere at its lateral edges.

Figure 4:
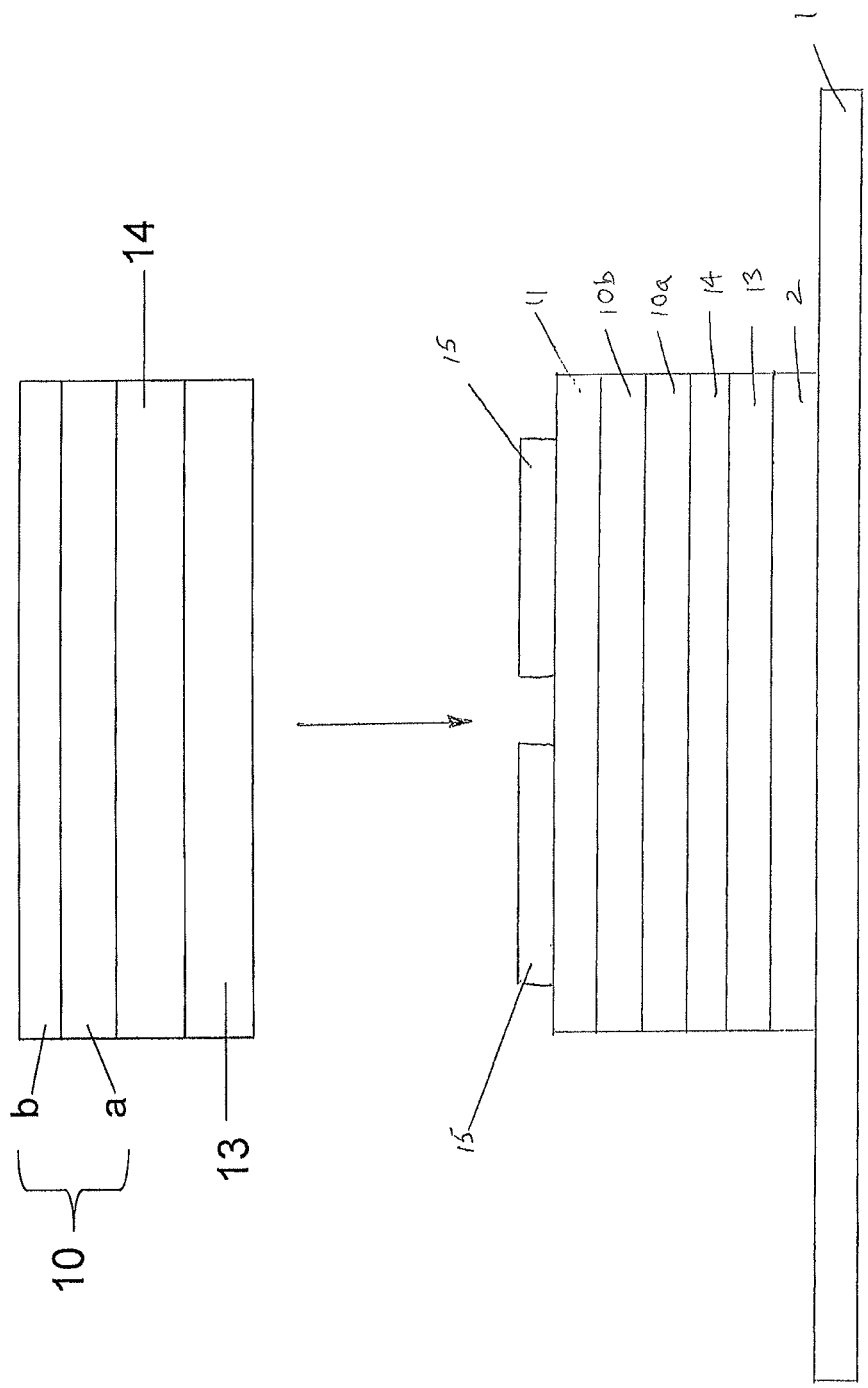
FIG. 4 illustrates another example of a structure for the device substrate of FIG. 1 in accordance with a third embodiment of the present invention.

In the embodiment illustrated in FIG. 4, the embodiment of FIG. 3 is modified by providing the device substrate material sheet 10 with an underlying film 13 to support and/or protect the barrier portion 10a prior to the TFT processing steps. The underlying film 13 is secured to the barrier portion via a layer 14 of a suitable adhesive, such as a PSA (pressure sensitive adhesive), which adhesive layer aids the integration of the underlying barrier protection/support film 13 on the underside of the device substrate material sheet 10, prior to the TFT processing steps. Underlying film 13 provides mechanical and physical protection only, as protection against the ingress of moisture and/or oxygen from the adhesive element 2 through to the TFT arrays 15 is provided by the barrier portion 10a. The barrier protection/support film 13 protects the barrier portion 10a from damage.

The support portion 10b can be made as thin as about 12 microns with the aim of reducing ingress of moisture to the TFT arrays via an exposed side edge of the support portion 10b whilst still providing sufficient structural support for the TFT arrays 15.

Because of the difference in the respective areas of the support portion 10b and the barrier portion 10a exposed to the degrading atmosphere, the water vapour transmission rate (WVTR) of the support portion 10b can be up to $10^4$ greater than the WVTR of the barrier portion 10a.

In each of the embodiments described above, the TFT arrays 15 can be additionally protected against ultraviolet radiation by building into the device substrate material sheet 10 an ultraviolet radiation barrier layer or coating.

With the techniques described above, the TFT arrays 15 can be protected against water ingression along the adhesive bond line of the adhesive element 2 used to secure the device substrate material sheet 10 to the carrier 1 without the need for a separate moisture barrier film between the adhesive element 2 and the device substrate 10. The device substrate material sheet 10 exhibits a lower WVTR than any other layer between the TFT arrays 15 and the top surface of the adhesive element 2, and thus provides the primary protection for the electronic elements against the ingress of moisture and oxygen via any of the adhesive layers that constitute the adhesive element 2 and/or otherwise via the bottom surface of the device substrate material sheet 10.

Figure 5:
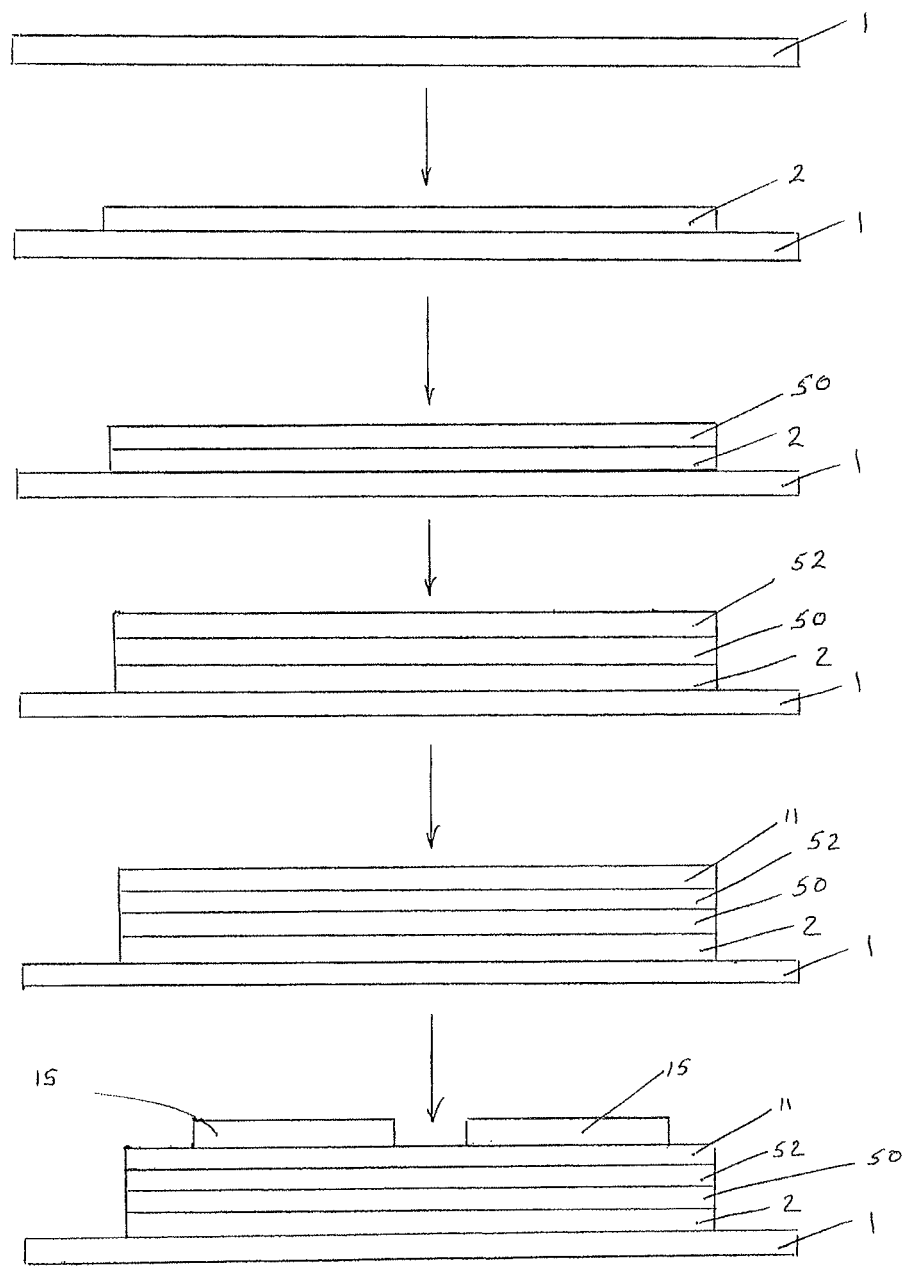
FIG. 5 illustrates the production of an electronic device in accordance with another embodiment of the present invention.

According to one variation of the techniques described above, the primary protection for the TFT arrays 15 (and any other overlying sensitive elements) against the ingress of moisture and/or oxygen via the adhesive element 2 is instead provided by a sheet of barrier material mounted on the rigid glass carrier 1 before mounting a sheet of the plastic support material on the rigid glass carrier. FIG. 5 illustrates such a technique. As in the embodiments described above, an adhesive element 2 is secured to the rigid glass carrier 1. Next, a sheet of barrier material 50 is laminated to the adhesive element 2. The sheet of barrier material comprises a plastic support film supporting an inorganic ceramic layer, and an adhesive layer provided on the surface of the inorganic ceramic layer opposite to the plastic support film. Next, a sheet 52 of device substrate material is secured to the sheet of barrier material using the adhesive layer provided on the above-mentioned inorganic ceramic layer. The sheet of device substrate material 52 is then processed as in the above-described embodiments, including the deposition of a planarisation layer 11, and the formation of TFT arrays 15 on the planarisation layer 11. The barrier material sheet 50 also has a water vapour transmission rate of between $10^{-1}$ and $10^{-7}$ g/m²/24 hours, and more particularly about 0.05 g/m²/24 hours, as measured under the following conditions: atmospheric pressure; 100% relative humidity; and a temperature of 38° C. A water vapour permeation instrument provided by Mocon, Inc. can be used to measure the water vapour transmission rate. The barrier material sheet 50 exhibits a lower WVTR than any other layer between the TFT arrays 15 and the top surface of the adhesive element 2, and thus provides the primary protection for the electronic elements against the ingress of moisture and oxygen via any of the adhesive layers that constitute the adhesive element 2 and/or otherwise via the side of the barrier material sheet 50 opposite to the device substrate 52.

TFT arrays have use as backplanes for flat panel display devices including liquid a crystal display medium and/or an electrophoretic display medium as the front plane.

We have chosen the example of a TFT array device for the description of techniques in accordance with embodiments of the present invention, but the same techniques are also applicable to other kinds of devices including one or more elements and/or interfaces are that susceptible to degradation by moisture and/or oxygen.

Also, for the above description of techniques in accordance with embodiments of the present invention, we have chosen the example of preventing the ingress of degrading species from adhesive layers used to secure a device substrate to a planar carrier. However, the same kind of techniques are also applicable to preventing the ingress of degrading species when a device substrate is mounted on other processing tools such as a support roller in a roll-to-roll technique.

Also, for the above description of techniques in accordance with embodiments of the present invention, we have chosen the example of forming a plurality of TFT arrays on a sheet of device substrate material and then later dividing the sheet of substrate material into individual device substrates. However, the same kind of techniques are also applicable to the case where one or more device substrates are secured individually to carrier before forming one or more electronic elements on the device one or more device substrates.

The present invention is not limited to the foregoing examples. In view of the foregoing description it will be evident to a person skilled in the art that various modifications may be made within the scope of the invention.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features.

The invention claimed is:

1. A method, comprising:
   mounting a device substrate on a processing support,
   forming a planarisation layer over the device substrate,
   forming a plurality of electronic elements on the device substrate with the device substrate thus mounted on the processing support,
   wherein the device substrate comprises a multilayer structure, the multilayer structure comprising a support portion and a barrier portion having a lower water vapour transmission rate than the support portion and located between the support portion and the planarisation layer; and wherein the multilayer structure does not include any further support portion between said support portion and the planarisation layer.

2. A method, according to claim 1, wherein the processing support is a planar carrier, said method further comprising:

securing said device substrate to said carrier using one or more adhesive layers; and wherein the device substrate provides primary protection for the overlying electronic elements against the ingress of a degrading species via the one or more adhesive layers and/or otherwise via the surface of the device substrate adjacent to said one or more adhesive layers.

3. A method according to claim 2, wherein the device substrate has a smaller water vapour transmission rate than any layer between the carrier and the device substrate.

4. A method according to claim 3, comprising forming the device substrate directly on an adhesive unit provided on the carrier.

5. A method according to claim 4, wherein the adhesive unit comprises adhesive layers on opposite sides of a support layer.

6. A method according to claim 2, wherein the degrading species is moisture and/or oxygen.

7. A method according to claim 1, wherein the device substrate has a water vapour transmission rate of between about $10^{-1}$ and $10^{-7}$ g/m$^2$/24 hours.

8. A method according to claim 1, wherein said support portion is an organic support portion, and said multilayer structure does not include any further organic support portion between said organic support portion and said planarisation layer.

9. A method according to claim 1, wherein said support portion is a plastic film, and said multilayer structure does not include any further plastic film between said plastic film and said planarisation layer.

10. A method according to claim 1, comprising forming the planarisation layer in direct contact with the barrier portion.

11. A device including an organic support portion supporting an array of electronic elements via a planarisation layer, and an inorganic moisture barrier layer between the organic support portion and the planarisation layer, wherein the device does not include any further organic support portion between said organic support portion and said planarisation layer.

12. A device according to claim 11, wherein the inorganic moisture barrier layer has a water vapour transmission rate of no more than 0.1 times that of the organic support structure.

13. A device according to claim 11, wherein the inorganic moisture barrier layer has a water vapour transmission rate of between about 10-1 and 10-7 g/m2/24 hours.

14. A device according to claim 11, wherein said support portion is a plastic film, and the device does not include any further plastic film between said plastic film and said planarisation layer.

15. A device according to claim 11, wherein the planarisation layer is in direct contact with the inorganic moisture barrier layer.

16. A method according to claim 1, wherein said device substrate is mounted on the processing support as part of a sheet that provides a plurality of device substrates.

17. A method, comprising:

mounting a device substrate on a processing support, forming a planarisation layer over the device substrate, forming an array of transistors on the device substrate with the device substrate thus mounted on the processing support, wherein the device substrate comprises a multilayer structure, the multilayer structure comprising a support portion and a barrier portion having a lower water vapour transmission rate than the support portion and located between the support portion and the planarisation layer;

wherein the multilayer structure does not include any further support portion between said support portion and the planarisation layer; and wherein the device substrate has a water vapour transmission rate of between 0.05 and 0.1 g/m$^2$/24 hours.

18. A method according to claim 1, wherein the device substrate includes an ultraviolet radiation barrier.

19. A method according to claim 1, wherein the multilayer structure does not include any further support portion between said support portion and said plurality of electronic elements.

20. A device according to claim 1, wherein the multilayer structure does not include any further organic support portion between said organic support portion and said array of electronic elements.

* * * * *